United States Patent [19]

Plies et al.

[11] Patent Number: 5,012,100

[45] Date of Patent: Apr. 30, 1991

[54] METHOD AND APPARATUS FOR INVESTIGATING THE LATCH-UP PROPAGATION IN COMPLEMENTARY-METAL-OXIDE SEMICONDUCTOR (CMOS) CIRCUITS

[75] Inventors: Erich Plies; Joerg Quincke, both of Munich, Fed. Rep. of Germany

[73] Assignee: Siemens Aktiengesellschaft, Berlin and Munich, Fed. Rep. of Germany

[21] Appl. No.: 346,920

[22] Filed: May 3, 1989

[30] Foreign Application Priority Data

Jun. 8, 1988 [DE] Fed. Rep. of Germany ....... 3819488

[51] Int. Cl.$^5$ ............... G01J 5/00; H04N 3/00; H04N 7/18
[52] U.S. Cl. ................... 250/342; 250/341; 250/358.1; 250/360.1; 250/347
[58] Field of Search ............... 250/340, 341, 342, 330, 250/347, 358.1, 360.1, 330, 458.1, 459.1, 334

[56] References Cited

U.S. PATENT DOCUMENTS

| | | | |
|---|---|---|---|
| 4,680,635 | 7/1987 | Khurawa | 358/211 |
| 4,755,874 | 7/1988 | Esrig et al. | 358/106 |
| 4,769,686 | 9/1988 | Horiuchi et al. | 357/23.8 |
| 4,786,170 | 11/1988 | Groebler | 356/318 |

FOREIGN PATENT DOCUMENTS

61-263235 5/1985 Japan.

OTHER PUBLICATIONS

Zanoni et al, "Observation of Latch-Up Time Evolution in CMOS IC's by Means of SEM Stroboscopic Voltage Contrast Techniques", IEEE Journal of Solid-State Circuits, vol. SC-22, No. 1, Feb. 1989, pp. 65-70.

Quincke et al, "Investigation of Surface-Induced Latch-Up in VLSI CMOS Using the Laser Probe", Microelectronic Engineering, vol. 7, 1987, pp. 371-375.

Wilke V., "Optical Scanning Microscopy-The Laser Scan Microscope", Scanning, vol. 7, 88-96, 1985.

Khwranan, "Pulsed Infra-Red Microscopy for Debugging Latchup on CMOS Products", IEEE/IRPS, vol., 1984, pp. 122-127.

Müller R., "Scanning Laser Microscope for Inspection of Microelectronic Devices", Siemens Forsch v. Entwickl-Ber, vol. 13, No. 1, 1984, pp. 9-14.

Otto et al, "Schaltungsznalyse in IC's mit dem Rzsterlzser Mikroscop", VDI Berichte, No. 659, 1987, pp. 381-394.

Primary Examiner—Constantine Hannaher
Assistant Examiner—Edward J. Glick
Attorney, Agent, or Firm—Hill, Van Santen, Steadman & Simpson

[57] ABSTRACT

Since known methods for investigating latch-up propagation have only a comparatively slight chronological resolution, a method and apparatus are proposed in which latch-up is periodically triggered and the intensity of the infrared radiation emanating from an integrated circuit is sensed at a plurality of measuring points that cover the circuit in a grid-like manner in order to respectively determine, at the measuring points, within what time span the intensity of the infrared radiation reaches a threshold, and to respectively register a measured value representing the time interval in a location-dependent manner.

14 Claims, 3 Drawing Sheets

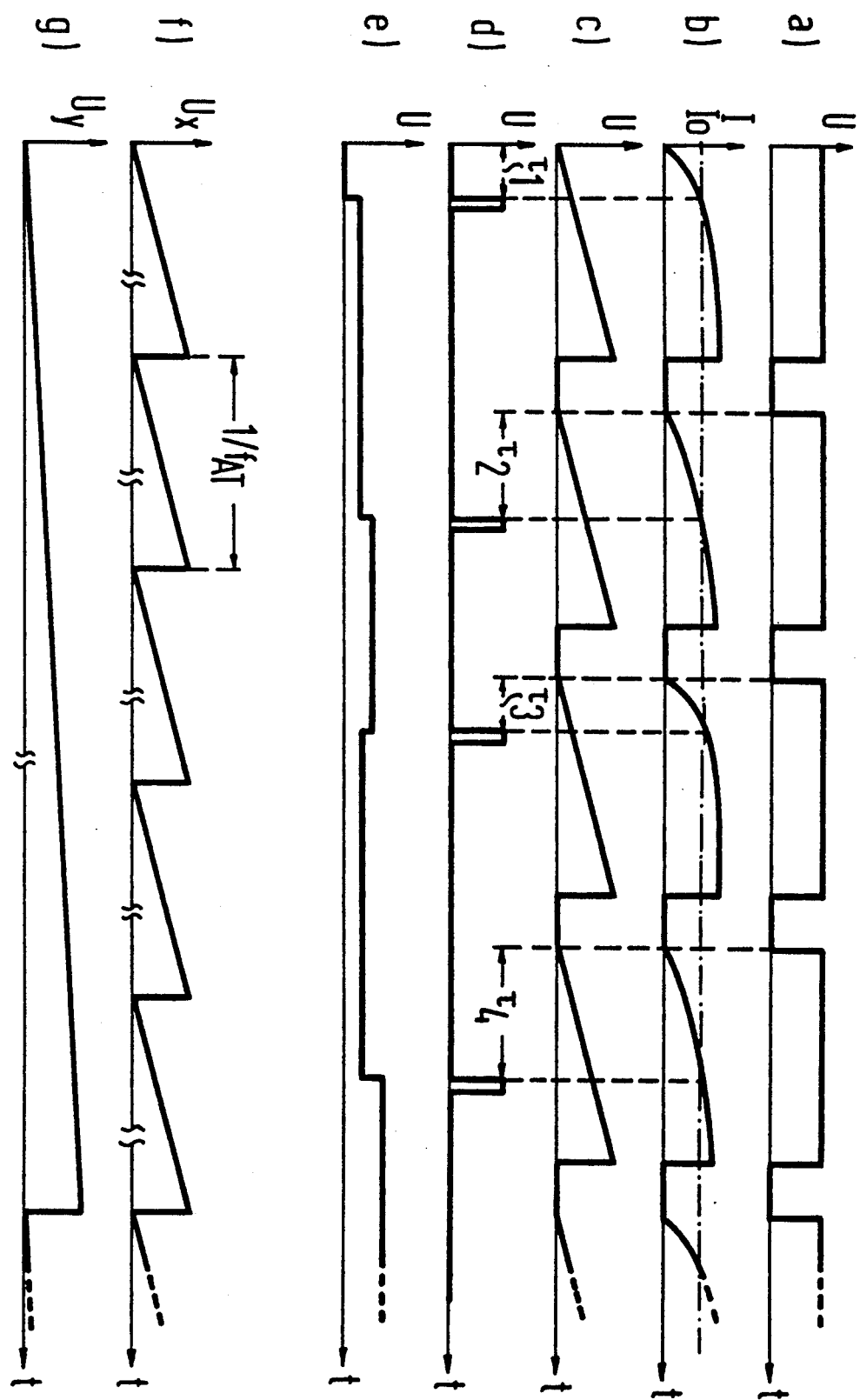

METHOD AND APPARATUS FOR INVESTIGATING THE LATCH-UP PROPAGATION IN COMPLEMENTARY-METAL-OXIDE SEMICONDUCTOR (CMOS) CIRCUITS

CROSS REFERENCE TO RELATED APPLICATION

This application is related to an application Ser. No. 346,921 filed May 3, 1989.

BACKGROUND OF THE INVENTION

1. Field of the Invention

The present invention relates to a method and to an apparatus for implementation of the method for the investigation of the latch-up propagation in complementary-metal-oxide-semiconductor (CMOS) circuits by documenting the infrared radiation (IR) emitted by the CMOS circuit.

2. Description of the Prior Art

Parasitic thyristor structures always exist in integrated CMOS circuits and the triggering thereof can lead to a destruction of the component as a consequence of the heating of the current paths that thereby occurs. Basically, this effect, referred to as latch-up, can be recognized on the basis of the discontinuous rise and the locking of the supply current without, however, being able to identify the affected circuit parts and improve them by modifying the design or with technological measures (higher well and substrate dopings, utilization of a low-impedance epitaxial layer, etc.). A series of methods for localizing latch-up sensitive regions in the integrated CMOS circuits have therefore been developed (for example, J. Otto, et al article entitled "Schaltungsanalyse in ICs mit dem Rasterlasermikroskop", VDI BERICHTE, No. 659, 1987, pp. 381-393; R. Muller, "Scanning Laser Microscope for Inspection of Microelectronic Devices" Siemens Forschungs-und Entwicklungsberichte, Vol. 13, No. 1, 1984, pp. 9-14; and N. Khurana, "Pulsed Infra-Red Microscopy for Debugging Latch-Up on CMOS Products", IEEE-/IRPS, International Reliability Physics Symposium 1984, pp. 122-127. The method disclosed by Khurana in the IEEE/IRPS article thereby particularly offers an advantage that the primary latch-up centers that cannot be localized with conventional liquid crystal techniques can also be identified.

SUMMARY OF THE INVENTION

The object of the present invention is to provide a method and an arrangement of the type set forth above with which the latch-up propagation in CMOS circuits can be investigated with high spatial and temporal resolution.

The above objects are achieved in a method for the investigation of the latch-up propagation in CMOS circuits by documentation of the infrared radiation emitted by the circuit, which is particularly characterized in that the latch-up was periodically triggered, the intensity of the infrared radiation is successfully registered at a plurality of measuring points, a respective determination is made at the measuring points to see within which time span after the triggering of the latch-up intensity of the infrared radiation reaches a threshold, and in that the measured value representing the time span is respectively registered in a location-dependent fashion.

An arrangement for implementing the method is particularly characterized by a lens system for focusing the infrared radiation emanating from the respective measuring point, a deflection unit driven by a scan generator whereby the output signals of the scan generator define the location of the respective measuring point within the circuit, a first pulse generator for generating a trigger signal that triggers the latch-up whereby one control input of the first pulse generator receives a clock signal that defines the change of measuring point, a detector for the documentation of the infrared radiation, a comparator, a second generator for generating a measured value the corresponds to the time span between the appearance of the trigger signal and the region of a threshold prescribed by the comparator, and a memory unit. The advantage which may be obtained in practicing the present invention is that the latch-up propagation in CMOS circuits can be investigated within high spatial and temporal resolution.

According to a particular feature of the method, an image of the CMOS circuit is generated on a viewing device whereby the time span defines the brightness of the picture elements respectively allocated to the measuring points. Another particular feature of the method of the invention is that the latch-up is triggerable by a particle beam directed onto the CMOS circuit.

Another feature of the method of the invention is that the latch-up is triggered by a electrical trigger signal. Another feature of the method of the invention is that the measuring points cover the circuit in a grid-like manner.

A particular feature of the arrangement is that a pulsed generator drives the CMOS integrated circuit. Another feature of the invention is that the means for generating a measured value is a sawtooth generator that has its input charged with the trigger signal and comprises a sample-and-hold circuit that has its input connected to the output of the sawtooth generator whereby the trigger input of the sample-and-hold circuit is charged with the output signal of the comparator.

Another feature of the arrangement of the invention is that a spatial filter precedes the detector.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a graphic illustration of the time dependency of signals occurring within the arrangement of the invention.

DESCRIPTION OF THE PREFERRED EMBODIMENTS

In the method disclosed by Khurana in the aforementioned IEEE/IRPS article, the latch-up propagation in CMOS modules is investigated by documentation of the infrared radiation emitted by the circuit. What is of particular significance is the thermal radiation having an intensity maximum at $\lambda = 8$–$10$ $\mu m$ arising due to the electrical heating of the thyristor structures and the infrared radiation having an intensity maximum at $\lambda = 1.1$ μm generated due to the recombination of excess electron-hole pairs, this mainly appearing in the region of the pn junctions polarized in the conducting direction. In order to be able to investigate the latch-up propagation in CMOS circuits with high spatial and temporal resolution in a modified scanning laser microscope, the following are proposed:

periodically triggering a parasitic thyristor structure of the circuit controlled by a trigger signal;

registering the intensity of the recombination radiation and/or thermal radiation (referred to in brief below as infrared radiation) successively at a plurality of measuring points that preferably cover a circuit in a grid-like fashion;

respectively identifying the measuring points when the intensity I (t) of the infrared radiation reaches a prescribed threshold $I_0$ within a time span $\tau$ after the triggering of the latch-up;

respectively registering a measured value representing the time span $\tau = t_s - t_0$, whereby $t_0$ references the point in time of the appearance of the trigger signal that initiates the latch-up and $t_s$ references the point in time that the threshold $I_0$ is reached; and as warranted, to generate an image of this circuit, whereby the time span $\tau$ defines the brightness of the picture elements respectively assigned to the measuring points.

Figure 1:
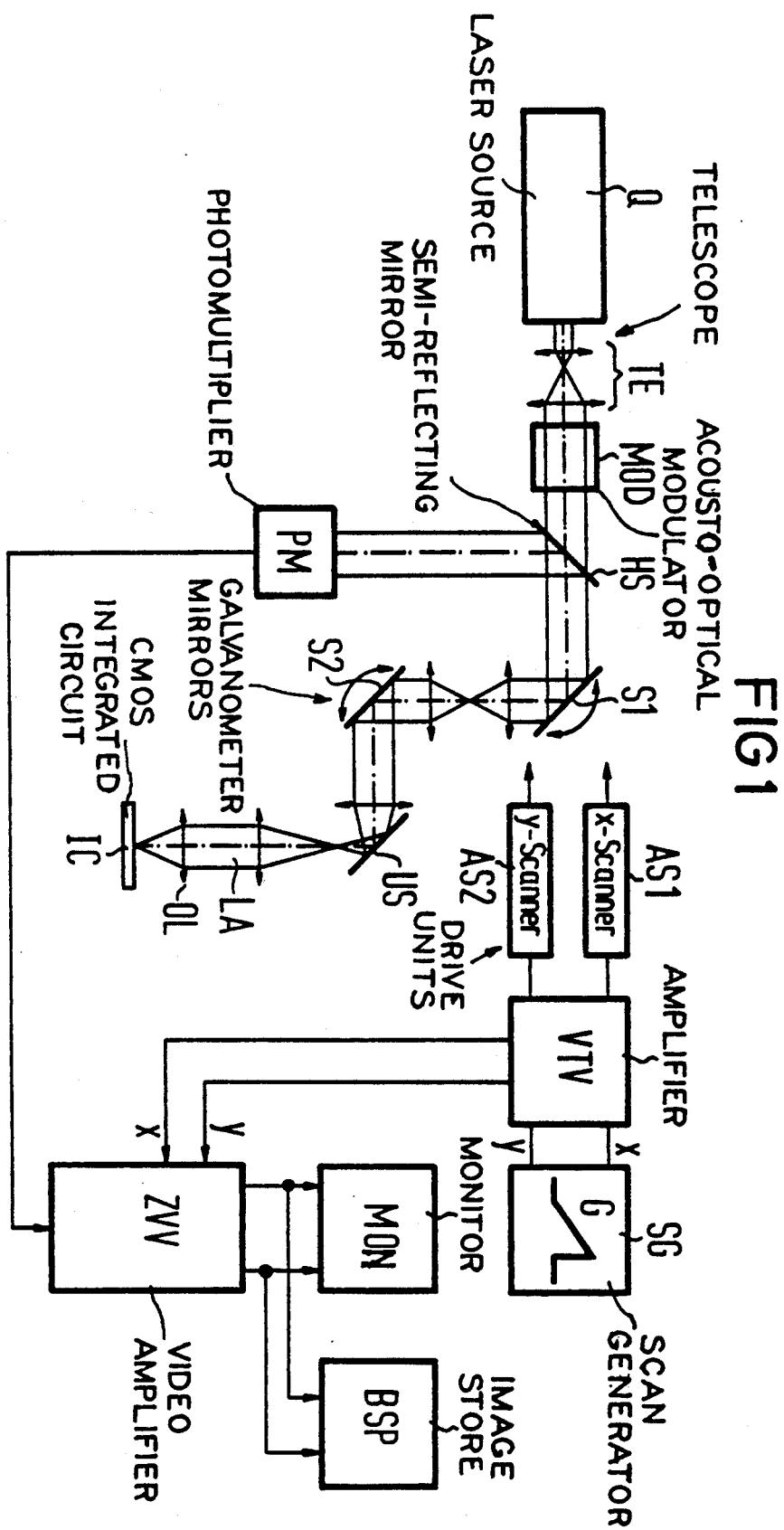
FIG. 1 is a schematic representation of the structure of a scanning laser microscope.

For example the scanning laser microscope known from the article by V. Wilke, entitled "Optical Scanning Microscopy—The Laser Scan Microscope", Scanning, Vol. 7, 1985, pp. 88-96, whose schematic structure is shown in FIG. 1, can be employed for the implementation of the method of the invention. This scanning microscope comprises a laser source Q (helium-neon laser), a telescope TE for expanding the laser beam LA, an acousto-optical modulator MOD, a semi-reflecting mirror HS, a deflection unit composed of two highly-accurate galvanometer mirrors S1 and S2, a deflecting mirror US and an objective lens OL for focusing the laser beam LA onto the specimen IC, preferably an integrated CMOS circuit. The scanning laser microscope is also equipped with a telescentric optics (not referenced in detail in FIG. 1) that assures that the laser beam LA topically rests in the pupil of the objective lens and therefore executes only an angular motion with the pupil as the pivot point. Independently of the position of the galvanometer mirrors S1 and S2, rotatable around orthogonal axes, therefore, the full aperture of the objective lens OL is always utilized, whereby the size of the beam spot on the specimen IC is independent of the location of the focus in the plane of the specimen surface.

The deflection voltages that define the position of the laser beam LA on the specimen IC are generated in a highly-accurate scan generator SG and are amplified in a tandem amplifier VTV whose output signals are applied to the inputs of the drive units AS1 and AS2 assigned to the mirrors S1 and S2. In order to generate a reflected light image of the specimen IC, the radiation back-scattered onto the objective lens OL and coupled out with the assistance of the semi-reflective mirror HS is documented with a photo-multiplier PM whose amplified output signal modulates the intensity of the write beam of the monitor MON. The monitor MON is preferably preceded by a video amplifier ZVV at whose inputs both the output signal of the photo-multiplier PM and the output signals of the tandem amplifier VTV that represent the location of the laser beam LA on the specimen IC are applied. The measured data (coordinates of the measuring point on the specimen IC, intensity of the back-scattered radiation, etc) are usually deposited in an image store BSP assigned to the monitor MON in order to be able to portray and evaluate them after the measurement.

Figure 2:
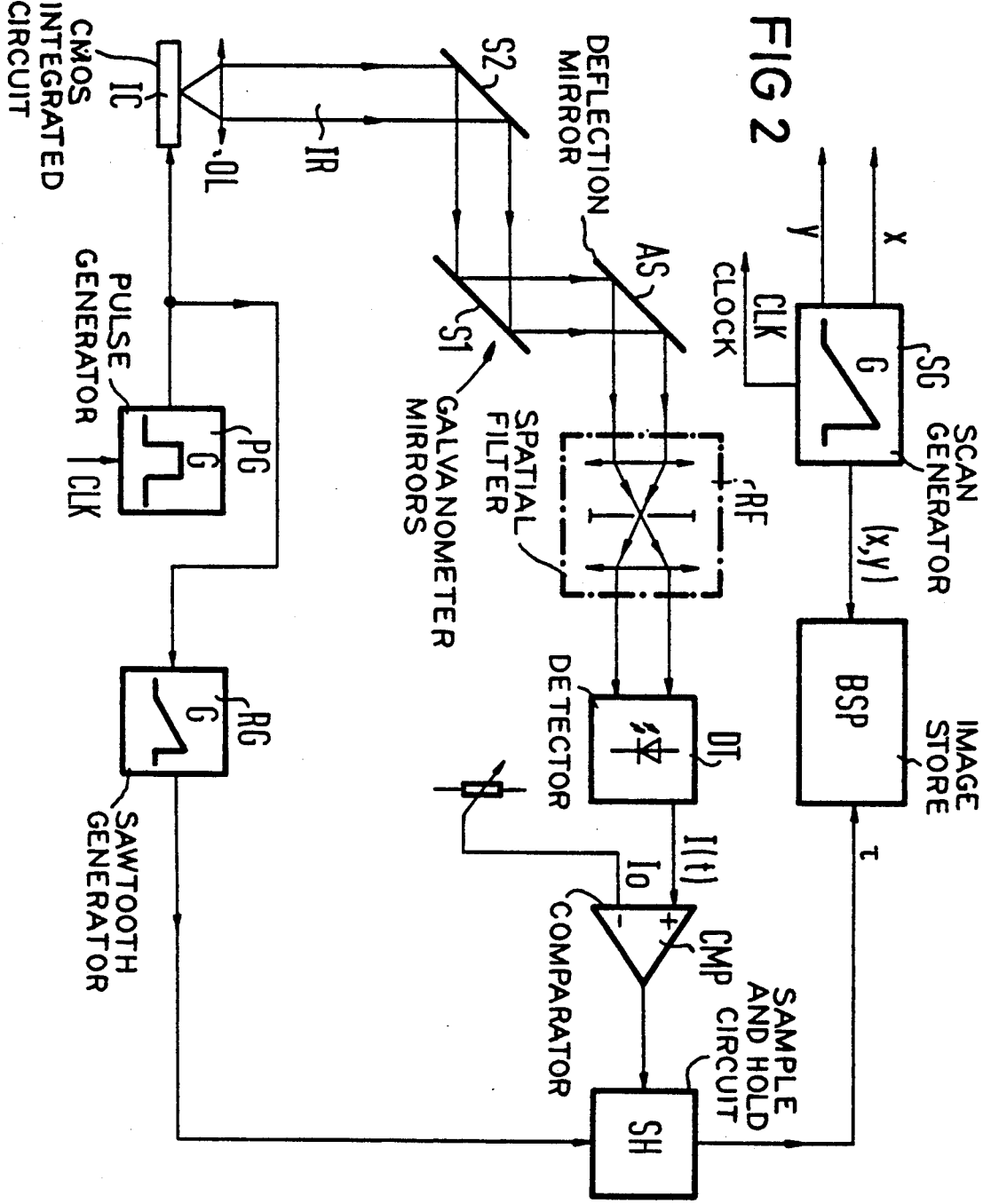
FIG. 2 is a schematic representation of an exemplary embodiment of an arrangement for implementing the method of the present invention.

For the implementation of the method of the invention, the scanning laser microscope is additionally equipped with another deflection mirror AS that can be brought into the beam path (see FIG. 2 in which only the components of the scanning laser microscope critical for the implementation of the method are shown), the infrared radiation IR emanating from the respective measuring point being coupled out with the additional deflection mirror AS and being supplied to the detector DT. The position of the measuring point on the specimen surface is thereby prescribed with the assistance of the deflection voltage of the scan generator SG that defines the position of the mirrors S1 or, respectively, S2. Therefore, the measuring points lie distributed over the specimen surface in a grid-like manner when the drive units AS1 and AS2 of the mirrors S1 and S2 are charged with sawtooth signals of the type shown in line f and g of FIG. 3.

The infrared radiation that is coupled out traverses a spatial filter RF (suppression of the noise and background radiation) composed of two lenses and an apertured diaphragm (aperture diameter a few μm) in order to be subsequently documented with a nitrogen-cooled germanium PIN diode. The detector DT is followed by a comparator CMP in which a signal representing the intensity I(t) of the infrared radiation IR is compared to a preferably variable threshold $I_0$. The comparator CMP always forwards a trigger signal to the sample-and-hold circuit SH that has its input side connected to a data input of the image store BSP when the intensity I(t) reaches the prescribed threshold $I_0$.

The latch-up is periodically triggered and suppressed in the specimen IC by the pulsed supply voltage. The drive of the specimen IC therefore occurs via a pulse generator PG that generates the latch-up trigger signal and whos control input is charged with a clock signal CLK that defines the change in measuring point (frequency $f_{AT} \approx 100$ Hz—1 kHz), for example with the internal clock signal of the scan generator SG. The output signal of the pulse generator (latch-up trigger signal, see a of FIG. 3) is thereby also applied to the input of the sawtooth generator RG whose output voltage (see line c of FIG. 3) is integrated in the sample-and-hold circuit SH until the intensity I(t) of the infrared radiation IR (see line b of FIG. 3) at the respective measuring point reaches the threshold $I_0$ prescribed in the comparator CMP (the trigger signal of the comparator CMP that ends the integration schematically illustrated in line d of FIG. 3). The output of the sample-and-hold circuit SH (see line e of FIG. 3) then represents the time interval $\tau = t_s - t_0$ lying between the appearance of the latch-up trigger signal (point in time $t_0$ and the reaching of the threshold $I_0$ (point in time $t_s$). The measured value corresponding to the time interval $\tau$ is subsequently read into the image store BSP whose second input simultaneously receives the coordinates of the respective measuring point from the scan generator SG. After the conclusion of the measurement, an image of the specimen IC can be generated on the monitor MON of the scanning laser microscope, whereby the measured value representing the time interval $\tau = t_s - t_0$ defines the brightness of the picture elements respectively assigned to the measuring points. Lines of equal brightness then show the propagation degree of the latch-up front at a defined point in time $t_s$.

The invention, of course, is not limited to a described exemplary embodiments. Therefore, it is possible to also trigger a parasitic thyristor structure with a laser or electron beam directed onto a latch-up sensitive region of the circuit.

Of course, it is also possible to split the out-coupled infrared radiation into two sub-beams representing the recombination radiation and the thermal radiation with the assistance of a beam splitter that is wavelength dependent and to respectively measure the intensities of the sub-beams in a detector that is sensitive for the appertaining radiation.

Although we have described the invention by reference to particular illustrative embodiments thereof, many other changes and modifications of the invention may become apparent to those skilled in the art without departing from the spirit and scope of the invention. It is therefore intended to include all such changes and modifications which may, within the scope of our contribution to the art.

We claim:

1. A method for investigation of latch-up propagation in a complementary-metal-oxide-semiconductor (CMOS) circuit by documenting infrared radiation emitted by the CMOS circuit, comprising the steps of:
   (a) defining a threshold for the intensity of the infrared radiation and indentifying and scanning a plurality of measuring locations on the CMOS integrated circuit;
   (b) triggering a latch-up condition at an identified measuring location causing it to emit infrared radiation;
   (c) measuring the time interval between the triggering of the latch-up condition and the infrared radiation reaching the predetermined threshold level;
   (d) recording the identity of the measuring location and the measured time interval; and
   (e) repeating the steps (b) through (d) for each of the remaining measuring locations.

2. The method of claim 1, wherein the steps (b) and (c) of triggering and measuring are further defined as:
   (b1) applying a trigger pulse to the CMOS integrated circuit; and
   (c1) detecting the infrared radiation while measuring the time interval after the appearance of the trigger pulse until the infrared radiation reaches the predetermined threshold level.

3. The method of claim 1, wherein the step (b) of triggering is further defined as:
   (b1) controlling triggering by applying a trigger signal to the CMOS integrated circuit.

4. The method of claim 3, wherein the step (b1) of controlling triggering by applying a trigger signal to the CMOS integrated circuit is further defined as:
   (b1a) periodically applying the trigger signal.

5. The method of claim 3, wherein the step (b1) of controlling triggering by applying a trigger signal to the CMOS integrated circuit is further defined as:
   (b1a) applying a particle beam to the CMOS integrated circuit.

6. The method of claim 3, wherein the step (b1) of controlling triggering by applying a trigger signal to the CMOS integrated circuit is further defined as:
   (b1a) applying a photon beam to the CMOS integrated circuit.

7. The method of claim 1, wherein the step (d) of recording is further defined as:
   (d1) imaging the CMOS integrated circuit with a plurality of picture elements on a picture screen; and
   (d2) controlling the brightness of the picture elements of the measuring locations in accordance with the respective measured time intervals.

8. The method of claim 1, wherein the step (b) of triggering is further defined as:
   (b1) applying a supply voltage to the CMOS integrated circuit; and
   (b2) modulating the supply voltage applied to the CMOS integrated circuit.

9. An arrangement for investigating latch-up propagation in a complementary-metal-oxide-semiconductor (CMOS) circuit by documenting infrared radiation emitted by the CMOS circuit, comprising:
   means for establishing a predetermined threshold level for infrared radiation;
   means for identifying and scanning a plurality of measuring locations on the CMOS integrated circuit;
   trigger means for triggering a latch-up condition at an identified measuring location causing it to emit infrared radiation;
   detecting means for receiving and detecting the infrared radiation, including time measuring means for measuring the time interval after triggering for the intensity of the infrared radiation to reach the predetermined threshold; and
   an image store connected to said detecting means for recording the identity of the measured location and the respective measured time interval.

10. The arrangement of claim 9, wherein said trigger means comprises:
   periodically-operating triggering means for periodically triggering latch-up conditions at respective measuring locations.

11. The arrangement of claim 10, wherein said image store is further defined as comprising:
   means for generating an image of the integrated circuit with a plurality of picture elements on a viewing device; and
   means for controlling the brightness of the picture elements of the image in accordance with the measured time intervals.

12. The apparatus of claim 10, wherein said trigger means comprises:
   means for applying a supply voltage to the CMOS integrated circuit and means for modulating the supply voltage.

13. The arrangement of claim 10, wherein said trigger means comprises:
   means for applying a particle beam to the CMOS integrated circuit.

14. The apparatus of claim 10, wherein said trigger means comprises:
   means for applying a photon beam to the CMOS integrated circuit.

* * * * *